United States Patent
Lim et al.

(10) Patent No.: US 8,045,077 B2
(45) Date of Patent: Oct. 25, 2011

(54) LIQUID CRYSTAL DISPLAY DEVICE AND FABRICATION METHOD THEREOF

(75) Inventors: Joo-Soo Lim, Gyeongsangbuk-Do (KR); Hee-Young Kwack, Seoul (KR)

(73) Assignee: LG Display Co., Ltd., Seoul (KR)

( * ) Notice: Subject to any disclaimer, the term of this patent is extended or adjusted under 35 U.S.C. 154(b) by 716 days.

(21) Appl. No.: 12/003,650

(22) Filed: Dec. 28, 2007

(65) Prior Publication Data
US 2008/0174709 A1 Jul. 24, 2008

(30) Foreign Application Priority Data
Dec. 29, 2006 (KR) .......... 10-2006-0139114

(51) Int. Cl.
*G02F 1/136* (2006.01)

(52) U.S. Cl. .............. 349/42; 349/43; 349/38; 349/187

(58) Field of Classification Search ................ None
See application file for complete search history.

(56) References Cited

U.S. PATENT DOCUMENTS

| | | | |
|---|---|---|---|
| 7,292,446 B2 | 11/2007 | Bae | |
| 7,403,245 B2 * | 7/2008 | Ahn et al. | 349/114 |
| 7,563,627 B2 * | 7/2009 | Cho et al. | 438/30 |
| 2001/0030718 A1 * | 10/2001 | Yoo et al. | 349/43 |
| 2004/0066472 A1 * | 4/2004 | Lim | 349/43 |
| 2005/0078233 A1 * | 4/2005 | Lim et al. | 349/43 |
| 2005/0095759 A1 * | 5/2005 | Cho et al. | 438/158 |
| 2005/0122442 A1 * | 6/2005 | Park | 349/43 |
| 2006/0139504 A1 * | 6/2006 | Ahn et al. | 349/42 |
| 2008/0002082 A1 * | 1/2008 | Lee et al. | 349/43 |
| 2010/0165224 A1 * | 7/2010 | Ahn et al. | 349/38 |

FOREIGN PATENT DOCUMENTS

| | | |
|---|---|---|
| JP | 2006-189865 | 7/2006 |
| KR | 2000-0010168 | 2/2000 |
| KR | 2001-0110315 | 12/2001 |
| KR | 10-0502091 | 7/2005 |

\* cited by examiner

*Primary Examiner* — Thanh-Nhan Nguyen
(74) *Attorney, Agent, or Firm* — Morgan, Lewis & Bockius LLP

(57) ABSTRACT

A method for fabricating a liquid crystal display includes: providing an array substrate and a color filter substrate facing the array substrate; forming a gate electrode and a gate line formed of a first conductive film on the array substrate through a first masking process; forming a second conductive film pattern at an upper portion of the gate electrode, a storage capacitor preliminary pattern at a partial upper region of the gate electrode and a data line substantially crossing the gate line to define a pixel region, the second conductive film pattern, the storage capacitor preliminary pattern and the data line being formed of a second conductive film through a second masking process; forming an opaque insulation film surrounding the data line; forming a transparent third conductive film on the entire surface of the array substrate with the opaque insulation film interposed therebetween; patterning the second conductive film pattern and a third conductive film through a third masking process to form a source electrode, a drain electrode separated from the source electrode, a pixel electrode contacting with the drain electrode, and a storage capacitor pattern contacting with a partial lower region of the pixel electrode; and attaching the array substrate and the color filter substrate.

9 Claims, 12 Drawing Sheets

LIQUID CRYSTAL DISPLAY DEVICE AND FABRICATION METHOD THEREOF

BACKGROUND OF THE INVENTION

1. Field of the Invention

The present invention relates to a liquid crystal display (LCD) and, more particularly, to an LCD capable of simplifying a fabrication process and improving fabrication efficiency by reducing the number of masks, and capable of reducing a wavy noise which is possibly generated when performing four masking processes.

2. Description of the Related Art

Recently, as diverse electronic devices such as a mobile phone, a PDA, a computer and a large TV, etc., are being developed, the demands for flat panel display devices that can be employed therefore are increasing.

The flat panel devices include an LCD (Liquid Crystal Display), a PDP (Plasma Display Panel), an FED (Field Emission Display), an VFD (Vacuum Fluorescent Display), etc. are being actively studied, and in terms of mass-production technologies, easiness of a driving unit and implementation of high picture quality, the LCD receives much attention.

The general LCD includes a liquid crystal panel, and the liquid crystal panel includes an array substrate, a color filter substrate attached with the array substrate with a certain gap therebetween, and a liquid crystal layer formed between the array substrate and the color filter substrate.

Liquid crystal for forming the liquid crystal layer is a material with optical anisotropy, and alignment of the liquid crystal varies according to an applied voltage to thus control light transmittance. Thus, a corresponding still image or moving picture is displayed on the LCD according to light transmittance of the liquid crystal layer.

FIG. 1 is a perspective view schematically showing the LCD according to the related art.

As shown in FIG. 1, the LCD 1 includes a color filter substrate 5, an array substrate 10, and a liquid crystal layer 30 formed between the color filter substrate 5 and the array substrate 10.

The color filter substrate 5 includes a color filter (C) including a plurality of sub-color filters 7 that implement red, green and blue colors, a black matrix 6 for dividing the sub-color filters 7 and blocking light transmission through the liquid crystal layer 30, and a transparent common electrode 8 for applying voltage to the liquid crystal layer 30.

The array substrate 10 includes gate lines 16 and data lines 17 which are IS arranged vertically and horizontally to define a plurality of pixel regions (P), TFTs, switching elements, formed at respective crossings of the gate lines 16 and the data lines 17, and pixel electrodes 18 formed on the pixel regions (P).

The color filter substrate 5 and the array substrate 10 are attached in a facing manner by a sealant (not shown) formed at an edge of an image display region to form a liquid crystal panel, and the attachment of the color filter substrates 5 and the array substrate 10 is made by an attachment key formed on the color filter substrate 5 or the array substrate 10.

FIGS. 2a to 2d are sectional views sequentially showing a fabrication process of the array substrate of the LCD in FIG. 1.

First, as shown in FIG. 2a, a gate electrode 21 made of a conductive material is formed on a substrate 10 by using a first masking process (first photolithography process).

Next, as shown in 2b, a gate insulation film 15A, an amorphous silicon thin film 24, an n+ amorphous silicon thin film 25 and a conductive metallic material 30 are sequentially deposited on the substrate 10 with the gate electrode 21 formed thereon.

Thereafter, a second masking process is performed for a selective patterning by using a half-tone mask such that a portion corresponding to the data line can be completely blocked against light and a portion corresponding to a channel region of the TFT is irradiated with a certain amount of light.

Accordingly, as shown in FIG. 2c, the amorphous silicon thin film layer is exposed, separating a source electrode 22 and a drain electrode 23, and certain portions of an active layer formed of the amorphous silicon thin film and the n+amorphous silicon thin film pattern are removed to form an ohmic contact layer 25'.

And then, a passivation film 15B is formed on the entire surface of the substrate 10 with the source and drain electrodes 22 and 23 formed thereon, and a contact hole exposing a portion of the drain electrode 23 is formed by using a third masking process.

Finally, as shown in FIG. 2d, a transparent electrode material is deposited on the entire surface so as to be connected with the drain electrode 23 via the contact hole and the pixel electrode 18 is patterned by using a fourth masking process.

After the array substrate is formed through the photography processes, it is attached with the color filter substrate to form a liquid crystal panel, and then, a backlight unit for supplying light to the liquid crystal panel is assembled to thus complete the LCD.

In this respect, however, because the active layer is formed of the amorphous silicon layer, when it receives light from the backlight unit, it becomes metal. Namely, the semiconductor has such characteristics that when it receives light and heat, its conductivity changes, so because the active layer of the liquid crystal panel is a semiconductor layer, when light is applied from the backlight unit, its conductivity increases to make the active layer metal.

Also, through the above-described processes, the active layer is formed with a line width wider than that of the data line and the source and drain electrodes, so that when the backlight unit is driven, even the active layer wider than the line width of the original data line is driven as the data line to cause an active tail phenomenon.

FIG. 3 is a sectional view showing the data line of the LCD using the 4-masking process according to the related art.

As shown, the n+ amorphous silicon layer 25 and the active layer 24 are formed at the lower portion of the data line 17, and in terms of the characteristics of an etching process, respective layers are formed to be tapered. Accordingly, the line width of the data line 17 is smaller than that of the lower active layer 24. In this respect, however, when the n+ amorphous silicon layer 25 and the active layer 24 become metal according to driving of the backlight, a region (C) corresponding to the line width of the data line 17 and the active layer 24 is driven as the data line.

As mentioned above, the related art LCD using the four masking processes has a problem that because the active layer 24 formed of the amorphous silicon becomes metal, when the backlight unit is driven, a wavy noise phenomenon occurs that wavy lines are continuously moved on a screen according to an ON/OFF operation.

In addition, in the related art, a black matrix (BM) should be formed with an additional margin of about 5 µm in order to prevent a light leakage that can be generated at an edge region (A) of the pixel electrode and a region (B) between the pixel electrode 18 and the data line 17, which causes degradation of an aperture ratio.

Moreover, because the processes of fabricating the LCD require multiple masking processes (namely, the photolithography processes), the processes are complicated and costs increase, so a method for reducing the number of masks is required.

SUMMARY OF THE INVENTION

Therefore, in order to address the above matters the various features described herein have been conceived. One aspect of the exemplary embodiments is to provide a liquid crystal display (LCD) and its fabrication method capable of preventing generation of a wavy noise of data lines and reducing the number of masks used for fabricating thin film transistors (TFTs).

Another aspect of the exemplary embodiments is to provide an LCD and its fabrication method capable of having a high aperture ratio by forming pixel electrodes on data lines.

This specification provides a method for fabricating an LCD including: providing an array substrate and a color filter substrate facing the array substrate; forming a gate electrode and a gate line formed of a first conductive film on the array substrate through a first masking process; forming a second conductive film pattern at an upper portion of the gate electrode, a storage capacitor preliminary pattern at a partial upper region of the gate electrode and a data line substantially crossing the gate line to define a pixel region, the second conductive film pattern, the storage capacitor preliminary pattern and the data line being formed of a second conductive film through a second masking process; forming an opaque insulation film surrounding the data line; forming a transparent third conductive film on the entire surface of the array substrate with the opaque insulation film interposed therebetween; patterning the second conductive film pattern and a third conductive film through a third masking process to form a source electrode, a drain electrode separated from the source electrode, a pixel electrode contacting with the drain electrode, and a storage capacitor pattern contacting with a partial lower region of the pixel electrode; and attaching the array substrate and the color filter substrate.

In the first masking process, the first conductive film is deposited on the array substrate and patterned to form the gate electrode and the gate line.

The second masking process includes: sequentially forming a first insulation film, an amorphous silicon thin film, an n+ amorphous silicon thin film and the second conductive film on the substrate with the gate electrode and the gate line formed thereon; coating a first photosensitive film with opaque photoacryl on the substrate with the second conductive film formed thereon; exposing light to the first photosensitive film through a mask having a transmission region that allows irradiated light to be entirely transmitted therethrough, a slit region that allows only some light to be transmitted therethrough and a blocking region that entirely blocks the light; developing the first photosensitive film to which light was irradiated through the mask to form a first photosensitive film pattern and a second photosensitive film pattern thicker than the first photosensitive film pattern on the second conductive film; and removing the amorphous silicon thin film, the n+ amorphous silicon thin film and the second conductive film by using the first and second photosensitive film patterns as masks to form the second conductive film pattern and the storage capacitor preliminary pattern at the lower portion of the first photosensitive film pattern and the data line substantially crossing the data line to define the pixel region at the lower portion of the second photosensitive film pattern.

The process of forming the opaque insulation film surrounding the data line includes: ashing the first and second photosensitive film patterns to remove the first photosensitive film pattern; and forming the opaque insulation film by curing the second photosensitive film pattern such that it surrounds the data line, and in this case, the curing process is performed at 100° C.~200° C.

The third masking process includes: coating the second photosensitive film on the array substrate with the third conductive film formed thereon; exposing light on the second photosensitive film through a mask having a transmission region that allows irradiated light to be transmitted therethrough and a blocking region that blocks the light; developing the second photosensitive film to which the light was irradiated through the mask, to form a third photosensitive film pattern; and removing portions of the third conductive film, the second conductive film pattern and the storage capacitor preliminary pattern, the n+ amorphous silicon layer and the amorphous silicon layer at the lower portion of the second conductive film pattern and the storage capacitor preliminary pattern by using the third photosensitive film pattern as a mask in order to form the source electrode, the drain electrode spaced apart from the source electrode, the pixel electrode contacting with the drain electrode, and a storage capacitor pattern contacting with a partial lower region of the pixel electrode.

The process of removing the portions of the third conductive film, the second conductive film pattern and the n+ amorphous silicon layer and the amorphous silicon layer at the lower portion of the second conductive film pattern by using the third photosensitive film pattern as a mask includes: performing over-wet etching on portions of the transparent conductive film and the second conductive film pattern by using the third photosensitive film pattern as a mask; and dry-etching portions of the n+ amorphous silicon layer and the amorphous silicon layer by using the third photosensitive film pattern as a mask.

In performing the dry-etching, $NH_3$ plasma is used.

Here, the third masking process may further includes: forming an insulation film on the entire surface of the substrate with the third photosensitive film pattern interposed therebetween after the step of forming the source and drain electrodes, the pixel electrode and the storage capacitor pattern; and lifting off the third photosensitive film pattern.

This specification also provides an LCD that may include: an array substrate divided into a pixel part and a pad part; gate lines formed of a first conductive film and data lines formed of a second conductive film arranged in vertical and horizontal directions to define pixel regions on the pixel part of the array substrate; thin film transistors (TFTs) formed at each crossing of the gate lines and data lines; pixel electrodes formed at the pixel region, some of the pixel electrodes being formed of a third conductive film overlapping with the data lines; and a color filter substrate attached with the array substrate in a facing manner.

Here, the TFT includes a gate electrode connected with the gate line; a first insulation film formed on the array substrate; an active pattern formed on the first insulation film; and a source electrode connected with the data line and a drain electrode directly electrically connected with the pixel electrode, the source electrode and the drain electrode being formed on the active pattern.

The pixel electrode overlaps with the data line with an opaque insulation film interposed therebetween, and the insulation film is made of photoacryl.

The LCD may further include a storage capacitor pattern for forming a storage capacitor together with the gate line with the first insulation film interposed therebetween, and the pixel electrode extends to a certain region of an upper portion of the gate line so as to be directly electrically connected with the storage capacitor pattern.

The storage capacitor pattern is made of the same conductive material as the source and drain electrodes and the data line.

The LCD may further include: a gate pad line formed of the first conductive film and formed on the pad part of the array substrate; and a data pad line formed of the second conductive film and formed on the pad part of the array substrate, and may further include: a gate pad electrode directly electrically connected with the gate pad line and a data pad electrode directly electrically connected with the data pad line, the gate pad electrode and the data pad electrode being formed of the third conductive film.

The third conductive film can be made of ITO (Indium Tin Oxide) or IZO (Indium Zinc Oxide), etc.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

The liquid crystal display (LCD) and its fabrication method will now be described in detail with reference to the accompanying drawings.

Figure 1:
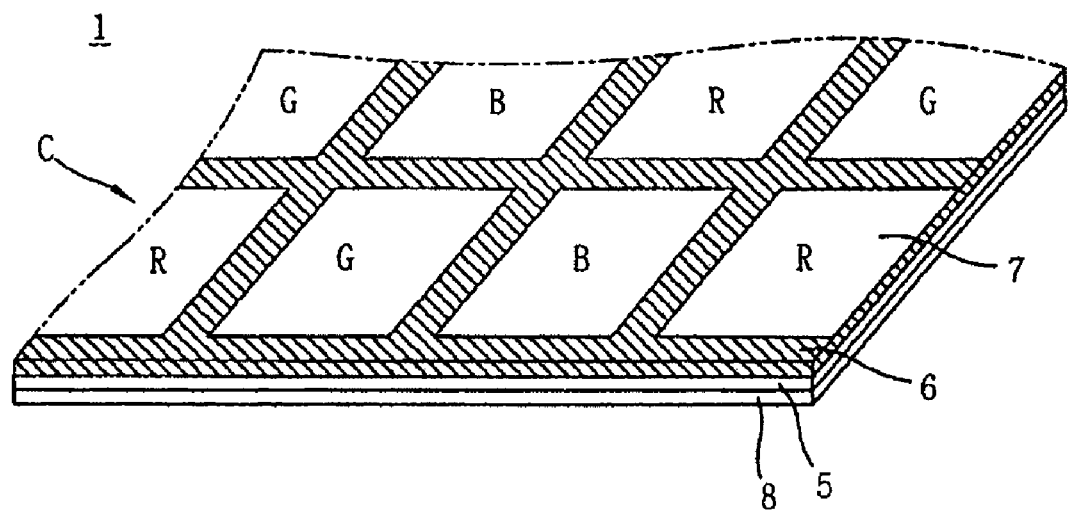
FIG. 1 is a perspective view schematically showing a liquid crystal display (LCD) according to the related art.
Figure 1:
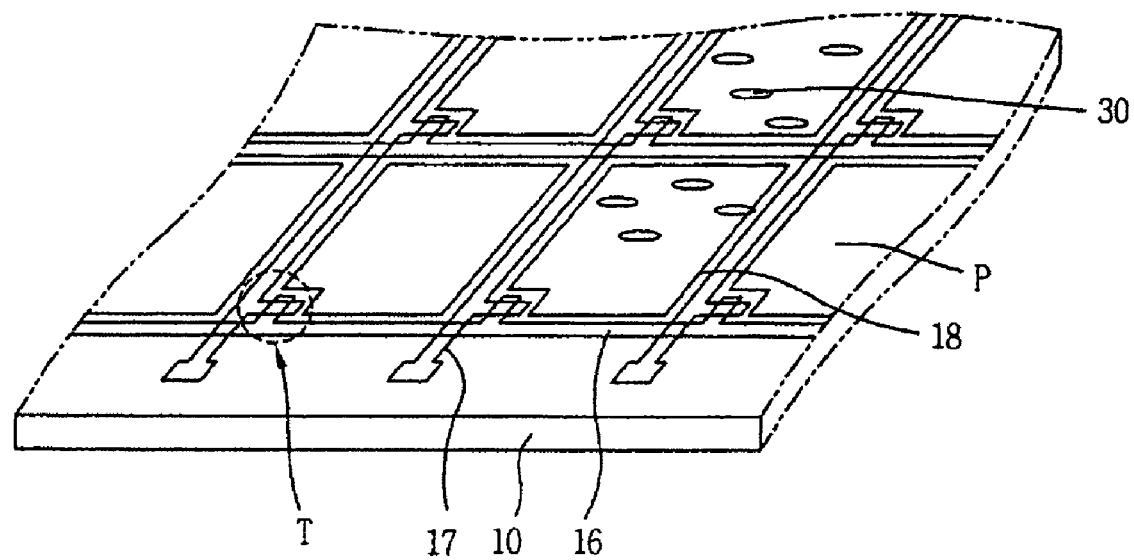
Figure 2A:
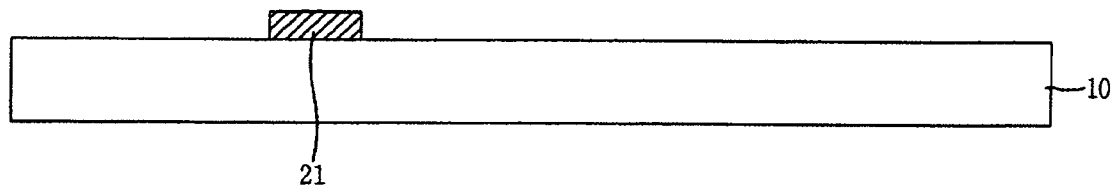
FIGS. 2a to 2d are sectional views sequentially showing a fabrication process of an array substrate of the LCD in FIG. 1.
Figure 2B:
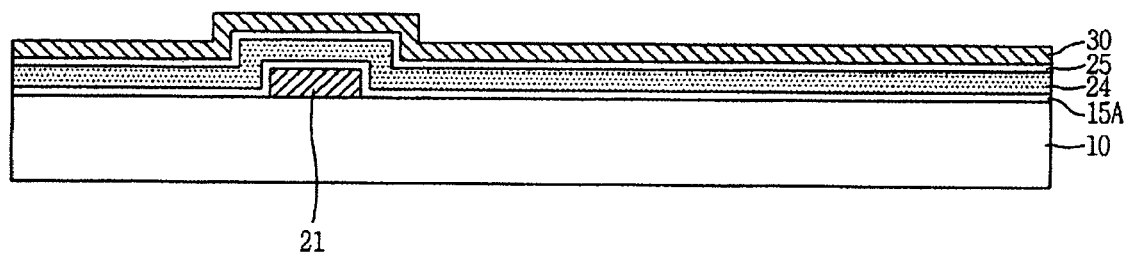
Figure 2C:
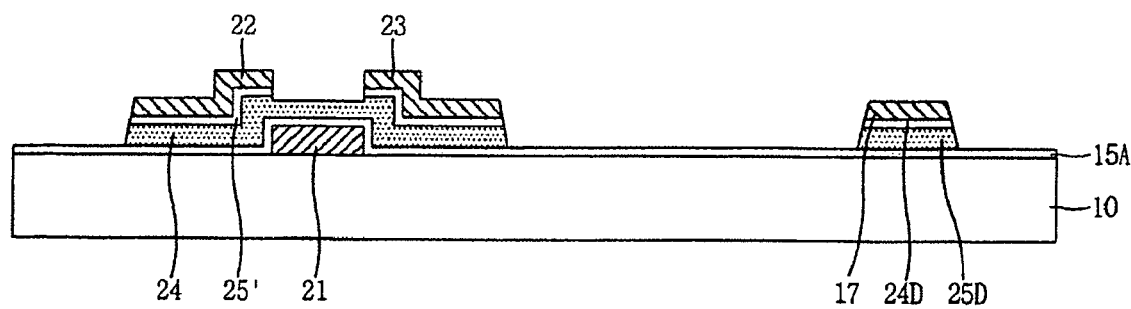
Figure 2D:
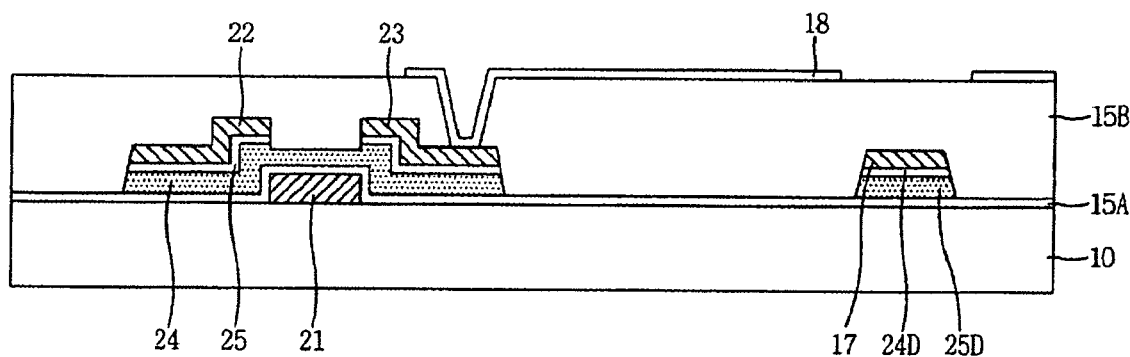
Figure 3:
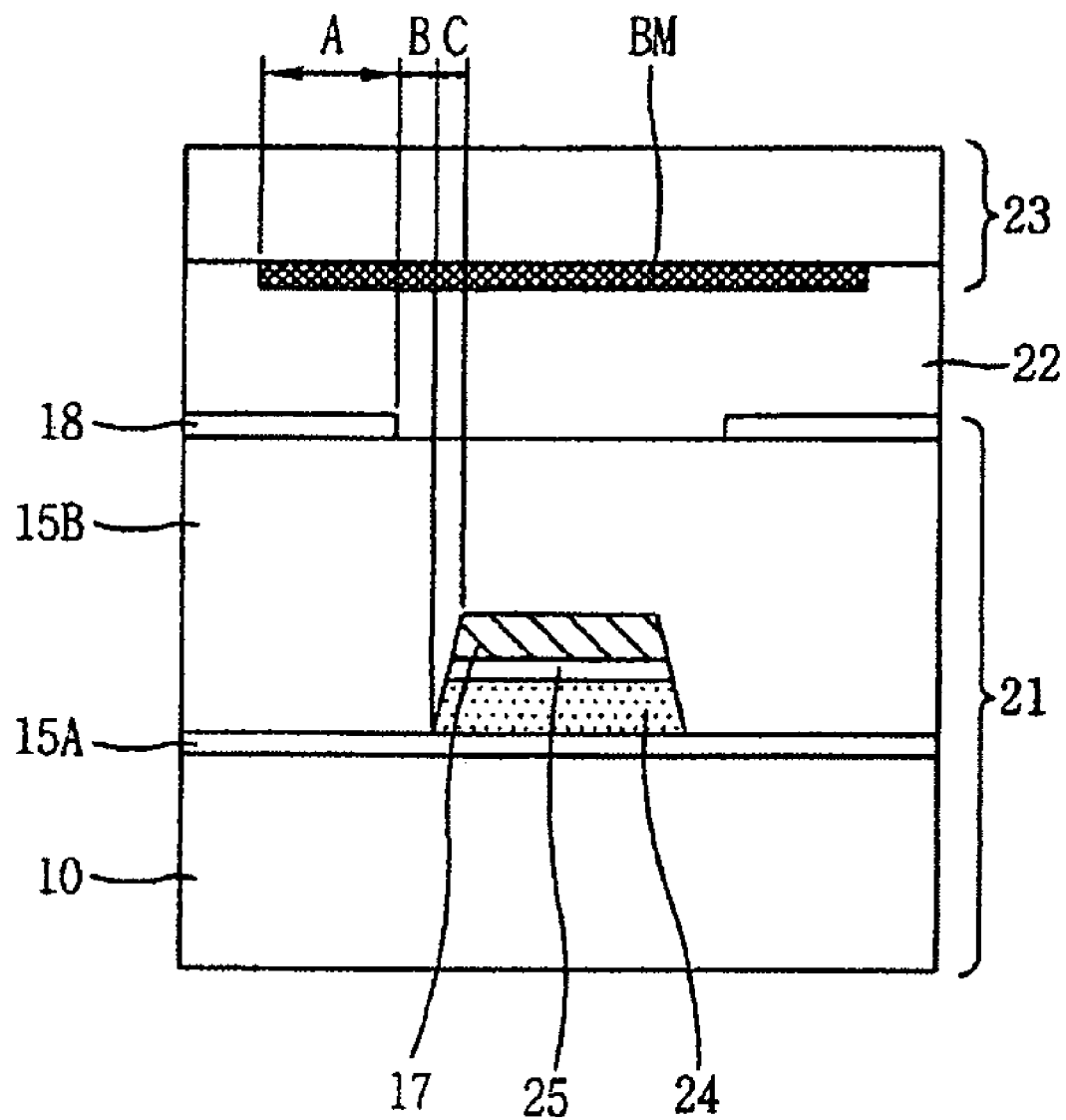
FIG. 3 is a sectional view showing a data line of the LCD using four masking processes according to the related art.
Figure 4:
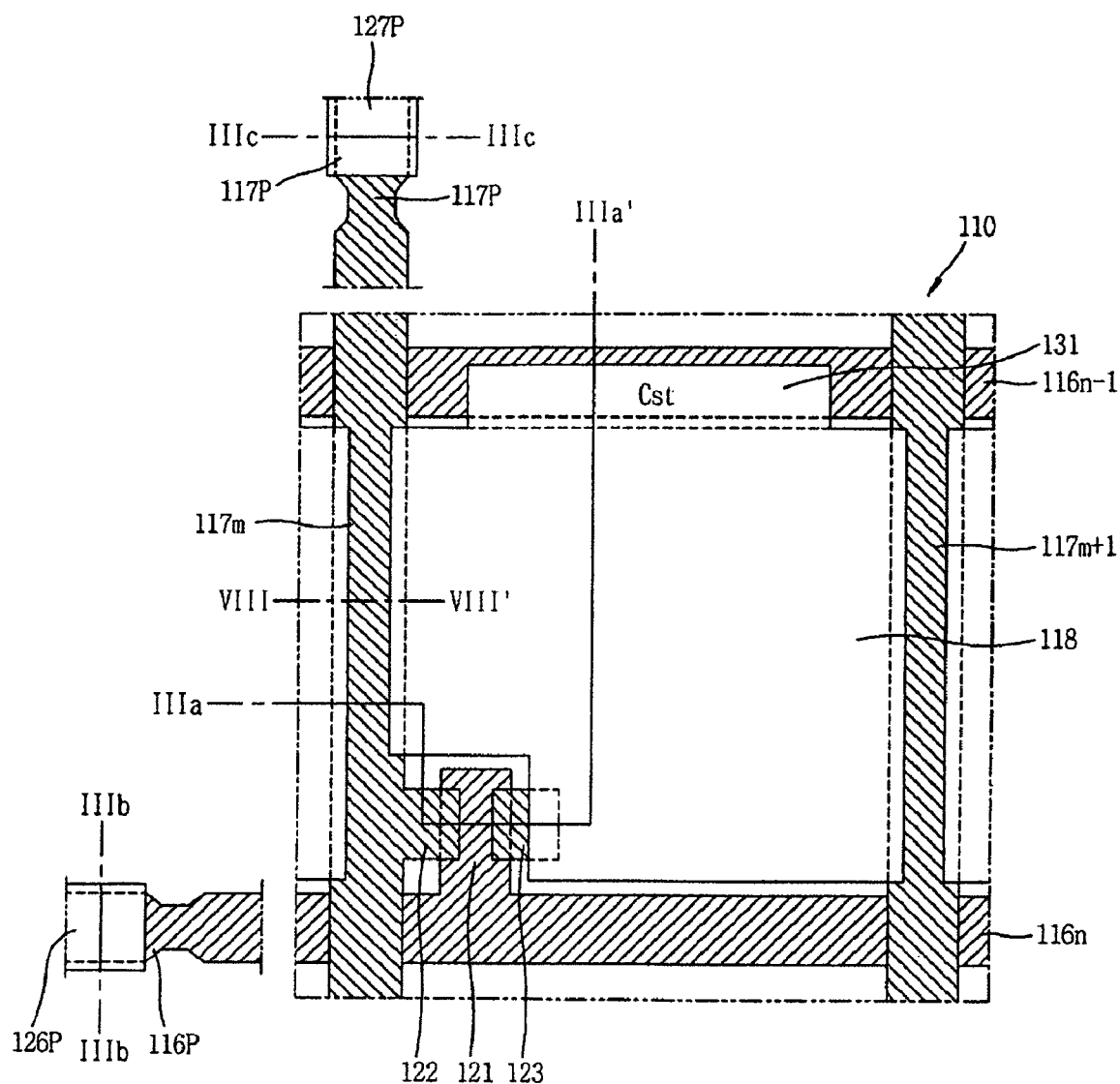
FIG. 4 is a plan view showing a portion of an array substrate of an LCD according to an exemplary embodiment of the present invention, in which a single pixel including a gate pad part and a data pad part is shown.

FIG. 4 is a plan view showing a portion of an array substrate of an LCD according to an exemplary embodiment of the present invention, in which a single pixel including a gate pad part and a data pad part is shown.

Actually, the N number of gate lines and M number of data lines are formed to cross each other to define the M×N number of pixels on the array substrate, and in order to simplify the explanation, only the single pixel is shown.

As shown, the nth gate line 116n and the mth data line are formed to be arranged vertically and horizontally to define the (m,n)th pixel region on the array substrate 110. A thin film transistor (TFT), a switching element, is formed at a crossing of the nth gate line 116n and the mth data line 117m. A pixel electrode 118 is formed within the pixel region and is connected with the TFT to drive liquid crystal (not shown) together with a common electrode of a color filter substrate (not shown).

A portion of the pixel electrode extends on the data line to overlap with the data line with a light blocking pattern (not shown) interposed therebetween.

A gate pad electrode 126P and a data pad electrode 127P are formed at edge portions of the array substrate 110 and electrically connected with the nth gate line 116n and the mth data line 117m, and transfer a scan signal and a data signal applied from an external driving circuit unit (not shown) to the nth gate line 116n and the mth data line 117m, respectively.

Namely, the nth gate line 116n and the mth data line 117m extend to the driving circuit unit so as to be connected with a gate pad line 116P and a data pad line 117P, respectively, and the gate pad line 116P and the data pad line 117P receive the scan signal and the data signal from the driving circuit unit through the gate pad electrode 126P and the data pad electrode 127P electrically connected with the gate pad line 116P and the data pad line 117P.

The TFT includes a gate electrode 121 connected with the nth gate line 116n, a source electrode 122 connected with the mth data line 117m, and a drain electrode 123 connected with the pixel electrode 118. The TFT also includes a first insulation film (not shown) for insulating the gate electrode 121 and the source an drain electrodes 122 and 123 and an active pattern (not shown) that forms a conductive channel between the source and drain electrodes 122 and 123 by a gate voltage supplied to the gate electrode 121.

A portion of the source electrode 122 is connected with the mth data line 117m to form a portion of the mth data line 117m, and a portion of the drain electrode 123 extends toward the pixel region so as to be directly electrically connected with the pixel electrode 118.

A portion of the (n−1)th gate line 116n−1, the previous gate line, overlaps with a storage capacitor pattern 131 formed at its upper portion and directly electrically connected with the pixel electrode 118 with the first insulation film interposed therebetween to form a storage capacitor Cst. The storage capacitor Cst serves to uniformly maintain the voltage applied to a liquid crystal capacitor until the next signal is applied.

Namely, the pixel electrode 118 of the array substrate 110 forms the liquid crystal capacitor together with the common electrode of the color filter substrate, and in general, the voltage applied to the liquid crystal capacitor is not maintained and leaked to disappear until the next signal is received. Thus, in order to maintain the applied voltage, the storage capacitor Cst should be connected with the liquid crystal capacitor and used.

Besides maintaining the signal, the storage capacitor also has the effects of stabilizing a gray scale display, reducing flickering effects, and reducing the formation of residual images.

The array substrate 110 according to the exemplary embodiment of the present invention constructed as described above can be fabricated by performing a masking process three times by using a selective etching of a transparent conductive film in the process of forming the pixel electrode 118. This will be described in detail through a fabrication process of the LCD as follows.

Figure 5A:
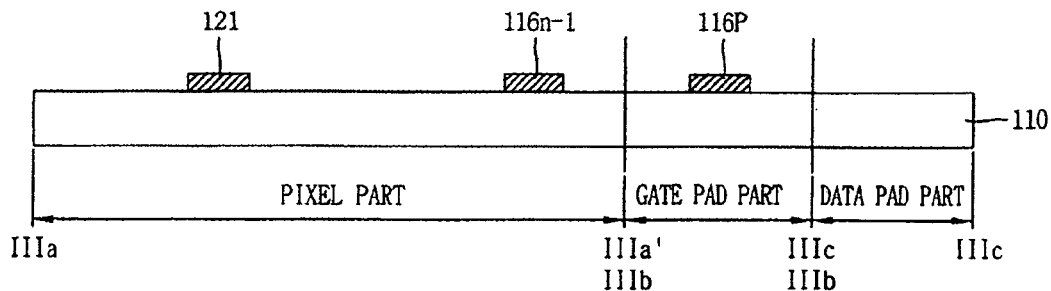
FIGS. 5a to 5c are sectional views sequentially showing a fabrication process of the array substrate in FIG. 4, in which the left portions show a process of fabricating the array substrate of the pixel part and the right portions show a process of fabricating the array substrate of the gate pad part and the data pad part sequentially.
Figure 5B:
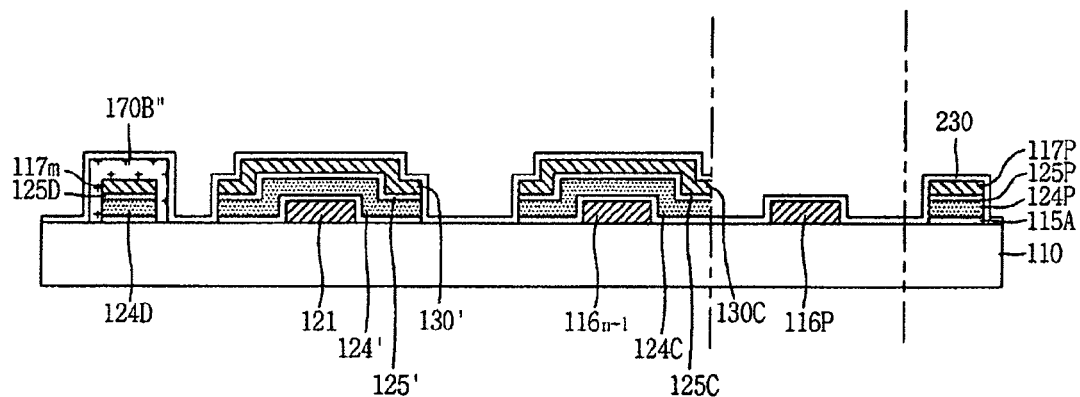
Figure 5C:
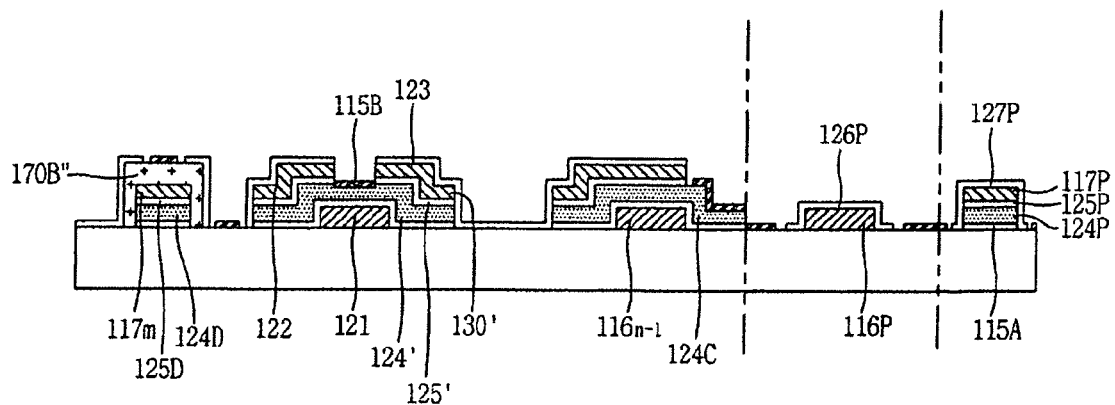

FIGS. 5a to 5c are sectional views sequentially showing a fabrication process of the array substrate in FIG. 4, in which the left portions show a process of fabricating the array substrate of the pixel part and the right portions show a process of fabricating the array substrate of the gate pad part and the data pad part sequentially.

As shown in FIG. 5a, the gate electrode 121 and the (n−1)th gate line 116n−1, are formed on the pixel part of the substrate 110 made of a transparent insulation material such as glass, and the gate pad line 116P is formed at the gate pad part. The (n−1)th gate line 116n−1, refers to the previous gate line with respect to the corresponding pixel, and the gate line of the corresponding pixel, namely, the nth gate line 116n, is formed in the same manner as the (n−1)th gate line 116n−1.

The gate electrode 121, the (n−1)th gate line 116n−1 and the gate pad line 116P are formed by depositing the first conductive film on the entire surface of the substrate 110 and patterning it through the photolithography process (a first masking process).

Here, the first conductive film can be made of a low-resistance opaque conductive material such as aluminum (Al), an aluminum alloy, tungsten (W), copper (Cu), chromium (Cr) and molybdenum (Mo), etc. Also, the gate electrode 121, the (n−1)th gate line 116n−1 and the gate pad line 116P can be formed with a multi-layered structure by stacking two or more low-resistance conductive materials.

Next, as shown in FIG. 5b, a first insulation film 115A, an amorphous silicon thin film, an n+ amorphous silicon thin film and a second conductive film are sequentially formed on the entire surface of the substrate 110, on which the gate electrode 121, the (n−1)th gate line 116n−1 and the gate pad line 116P have been formed, and then patterned through the photolithography process (a second masking process) using a slit (diffraction) mask and opaque photoacryl to form an active layer 124', the mth data line 117m and a data pad line 117P. And then, the data line is cured to be covered by an insulation film. Thereafter, a transparent third conductive film 230 to be used as a pixel electrode and an electrode of the pad part is formed on the entire surface of the substrate 110.

In this manner, the data line is cured and the transparent third conductive film to become the pixel electrode is formed through the single masking process (the second masking process) using the slit exposure. The second masking process will now be described in detail with reference to the accompanying drawings.

FIGS. 6a to 6f are sectional views sequentially showing the process of forming the cured data line, etc. through the second masking process.

Figure 6A:
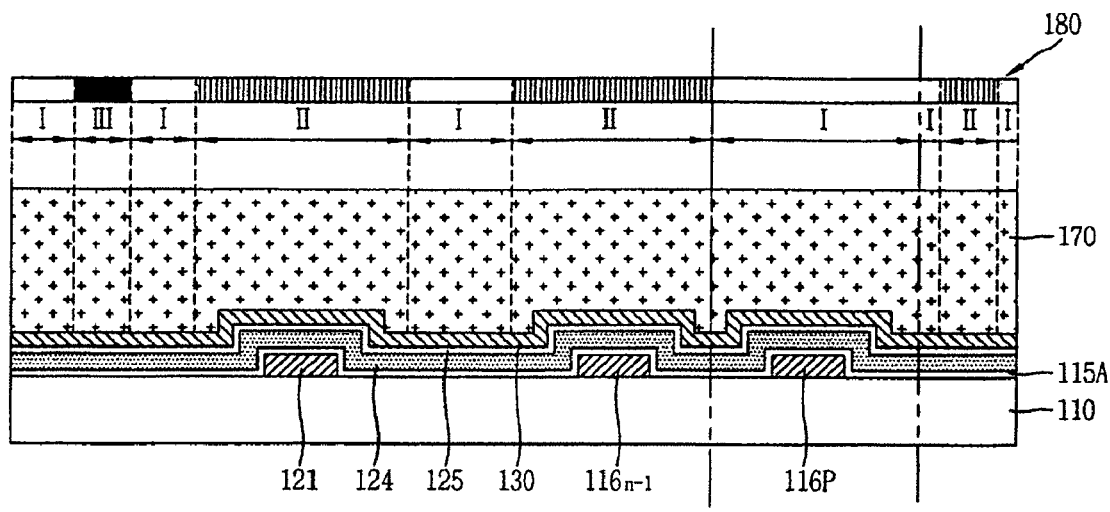
FIGS. 6a to 6f are sectional views sequentially showing a process of forming a cured data line, etc. through a second masking process.

As shown in FIG. 6a, the first insulation film 115A, the amorphous silicon thin film 124, the n+ amorphous silicon thin film 125 and the second conductive film 130 are sequentially deposited on the entire surface of the substrate 110 on which the gate electrode 121, the (n−1)th gate line 116n−1 and the gate pad line 116P have been formed.

Thereafter, a photosensitive film 170 made of a photosensitive material such as photoacryl capable of implementing color is formed on the entire surface of the substrate 110, to which light is then selectively irradiated through the slit mask 180 in this case, the photosensitive film is made of opaque photoacryl so as to function as a light blocking layer for preventing a light leakage of the data line through patterning and curing.

The slit mask 180 used in the exemplary embodiment of the present invention includes a transmission region I that allows irradiated light to be entirely transmitted therethrough, a slit region (II) with a slit pattern that allows only some light to be transmitted therethrough while blocking the remaining light, and a blocking region (III) that entirely blocks the irradiated light, and only light that has transmitted through the slit mask 180 is irradiated onto the photosensitive film 170.

Figure 6B:
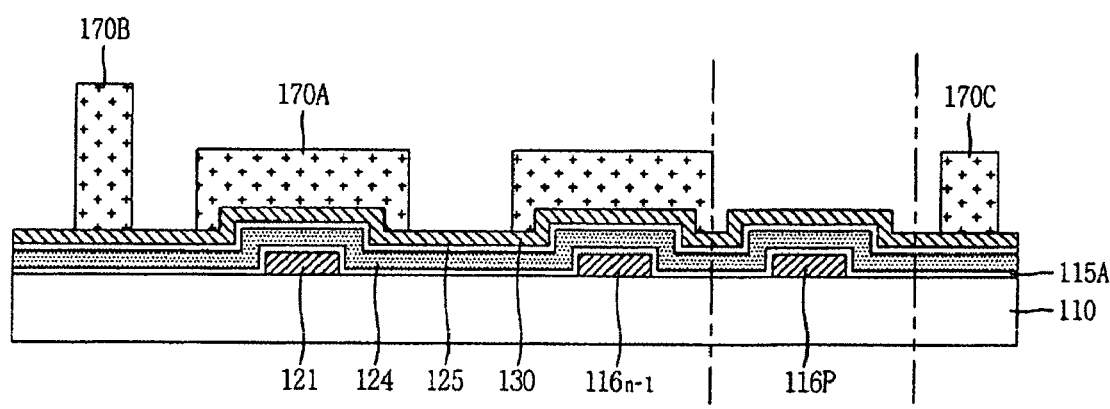

Subsequently, when the photosensitive film 170 which was exposed through the slit mask 180 is developed, as shown in FIG. 6b, photosensitive film patterns 170A to 170C remain with a certain thickness at regions where light was entirely blocked or partially blocked through the blocking region (III) and the slit region (II), and the photosensitive film at the transmission region (I) through which light was entirely transmitted was completely removed to expose the surface of the second conductive film 130.

At this time, the first photosensitive film pattern 170A formed through the slit region II and the third photosensitive film pattern 170C are thinner than the second photosensitive film pattern 170B formed through the blocking region III. The photosensitive film at the region where the light entirely transmitted through the transmission region I was completely removed. This is because positive photoresist was used, but without being limited thereto, negative photoresist can be also used in the present invention.

Figure 6C:
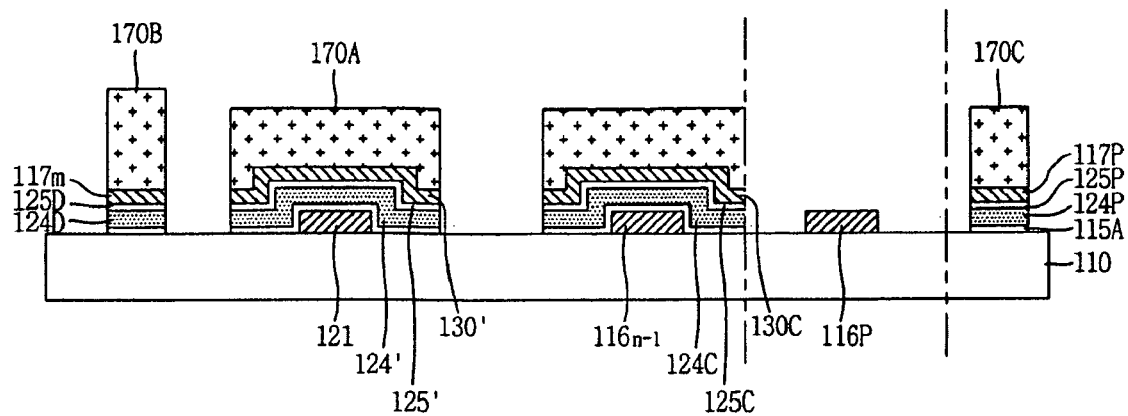

Next, as shown in FIG. 6c, the amorphous silicon thin film 124, the n+ amorphous silicon thin film 125, the second conductive film 130 and the first insulation film 115A are selectively removed by using the photosensitive film patterns 170A to 170C as masks to form the active pattern 124' formed of the amorphous silicon thin film 124 at a certain region of the upper portion of the gate line 121 and, at the same time, an ohmic-contact layer 124' and a second conductive film pattern 130' formed of the n+ amorphous silicon thin film 125 and the second conductive film 130 are patterned in the same shape as the active pattern 124' and remain.

A second conductive film pattern 130C (storage capacitor preliminary pattern) electrically connected with the pixel electrode (to be described) for forming the storage capacitor is formed at a certain region of the upper portion of the (n−1)th gate line 116n−1, and an amorphous silicon thin film pattern 124C and an n+ amorphous silicon thin film pattern 125C formed of the amorphous silicon thin film 124 and the n+ amorphous silicon thin film 125 are patterned in the same shape as the second conductive film pattern 130C and remain at the lower portion of the second conductive film pattern 130C.

The mth data line 117m formed of the second conductive film 130 is formed at one portion of the pixel part of the substrate 110, and an amorphous silicon thin film pattern 124D and an n+ amorphous silicon thin film pattern 125D formed of the amorphous silicon thin film 124 and the n+ amorphous silicon thin film 125 are patterned in the same shape as the data line 117m and remain at the lower portion of the data line 117m.

The data pad line 117P formed of the second conductive film 130 is formed at the data pad part of the substrate 110, and an amorphous silicon thin film pattern 124P and an n+ amorphous silicon thin film pattern 125P formed of the amorphous silicon thin film 124 and the n+ amorphous silicon thin film 125 are patterned in the same shape as the data pad line 117P and remain at the lower portion of the data pad line 117P.

Figure 6D:
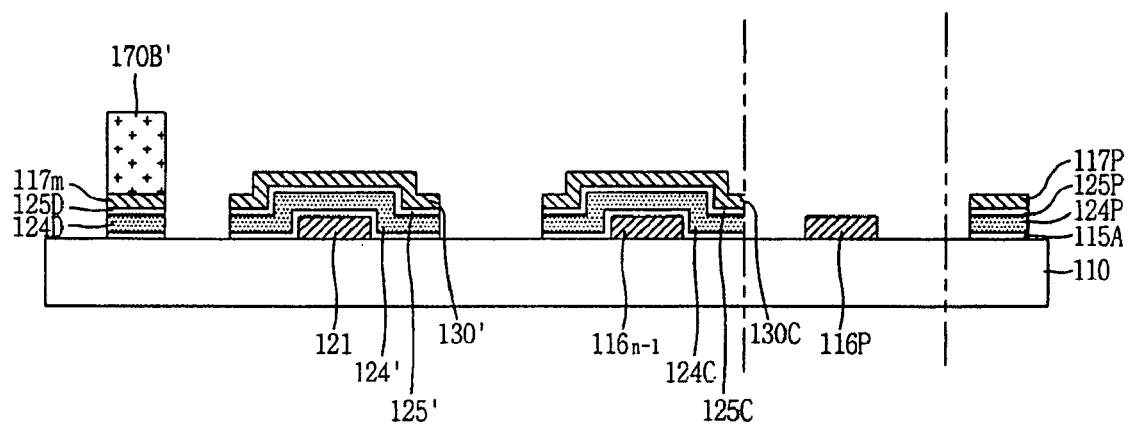

Thereafter, when an ashing process is performed to remove portions of the photosensitive film patterns 170A to 170C, as shown in FIG. 6d, the first photosensitive film patterns 170A and 170C at the upper portion of the certain region of the gate electrode 121, at the upper portion of a certain region of the (n−1)th gate line 116n−1, and at the upper portion of the data pad line 117P, namely, at the slit region II to which the slit exposure was applied, are completely removed to expose the surface of the second conductive film patterns 130', 130C and 117P.

In this case, the second photosensitive film patterns 170B remains as a fourth photosensitive film pattern 170B' with a thickness obtained by removing the thickness of the first and third photosensitive film patterns 170A and 170C at the certain region corresponding to the blocking region (III).

Figure 6E:
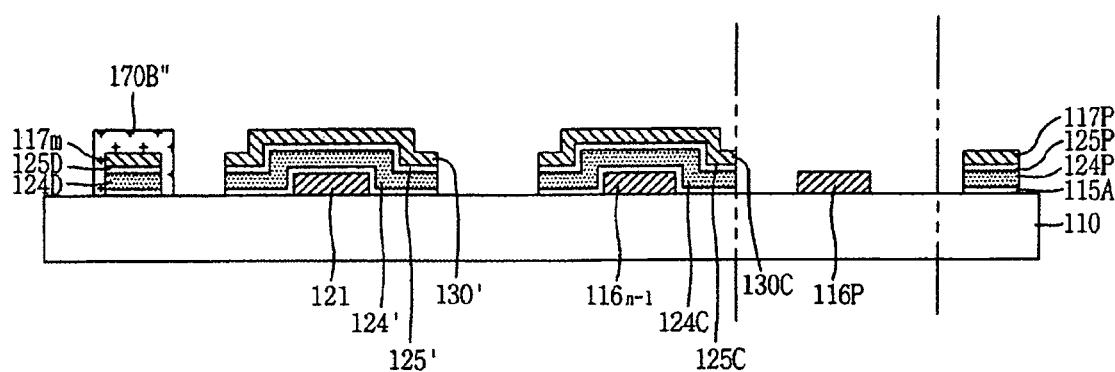

Thereafter, as shown in FIG. 6e, the fourth photosensitive film pattern 170B' remaining at the upper portion of the mth data line 117m is cured at 100° C.~200° C. to form a data line blocking pattern 170B" covering the upper portion and the side portion of the mth data line 117m. In this case, because the data line blocking pattern 170B" are made of opaque photoacryl, it serves as a black matrix that covers the mth data line 117m.

Figure 6F:
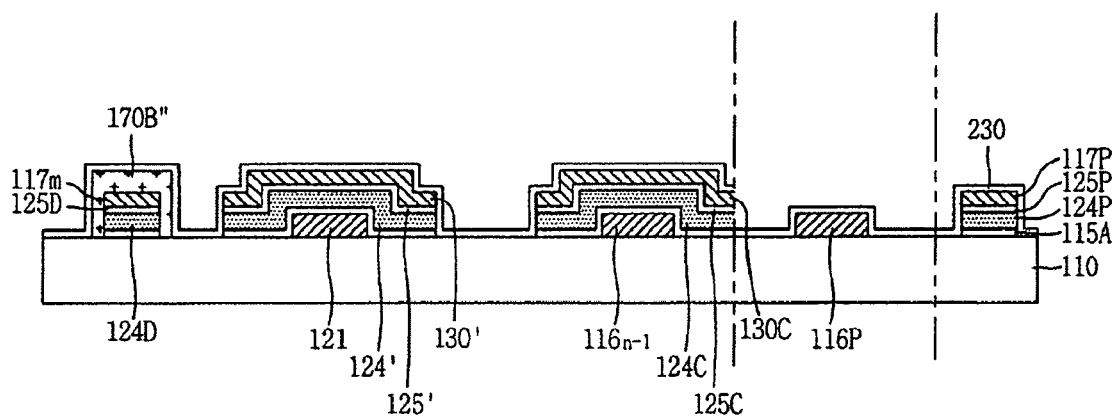

And, as shown in FIG. 6f, the third conductive film 230 is made of a transparent conductive material on the entire surface of the substrate 110 on which the second conductive film pattern 130' at the upper portion of the gate line 121 and the fifth photosensitive film pattern 170B" have been formed.

In this case, the third conductive film 230, which is to form the pixel electrode and the pad part electrode, can be made of a transparent conductive material with good transmittance such as ITO or IZO.

And then, as shown in FIG. 5c, the active pattern 124', the amorphous silicon thin film pattern 124C, the n+ amorphous silicon thin film patterns 125' and 125C, the second conductive film pattern 130' and 130C, and the third conductive film 230 are selectively patterned by using the photosensitive film through a single photolithography process (the third masking process) to form the source and drain electrodes 122 and 123 and the pixel electrode 118.

At the pad part, the third conductive film 230 is selectively patterned by using the photosensitive film as a mask through the third masking process to form the gate pad electrode 126P and the data pad electrode 127P formed of the third conductive film 230.

Thereafter, the second insulation film 115B is formed to protect the exposed channel region, and then, the photosensitive film is lifted off.

As stated above, in the exemplary embodiment of the present invention, the source and drain regions 122 and 123 are formed through the single photolithography process (the third masking process). The third masking process will now be described in detail.

FIGS. 7a to 7e are sectional views sequentially showing a process of simultaneously forming source and drain electrodes through a third masking process.

Figure 7A:
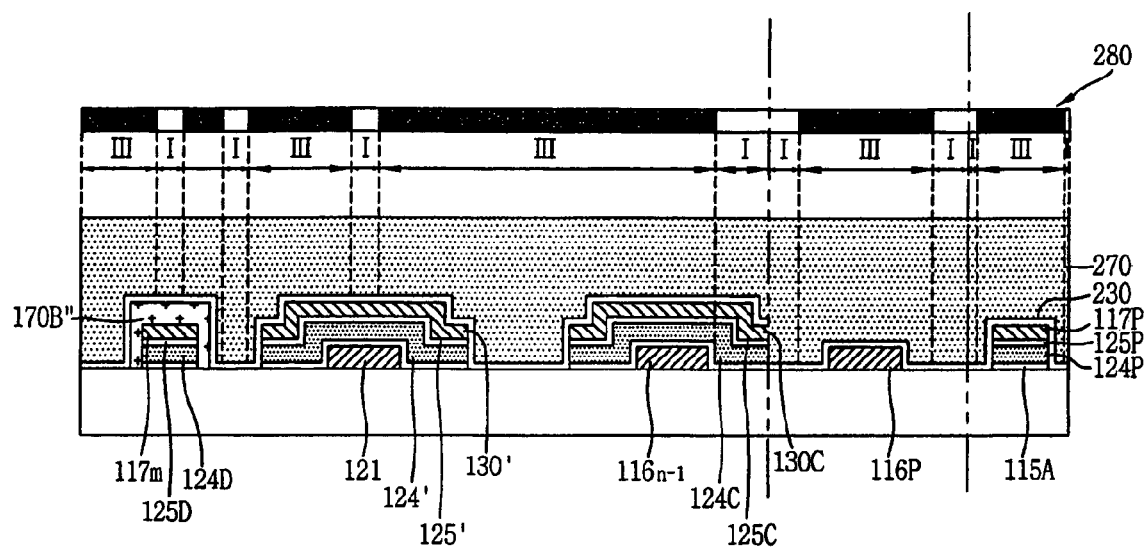
FIGS. 7a to 7e are sectional views sequentially showing a process of simultaneously forming source and drain electrodes through a third masking process.

As shown in FIG. 7a, a photosensitive film 270 such as photoresist is formed on the entire surface of the substrate 110 with the third conductive film 230 formed thereon, to which light is then selectively irradiated through a mask 280.

The mask 280 includes a transmission region I that allows irradiated light to be entirely transmitted therethrough and a blocking region (III) that entirely blocks the irradiated light, and only light that has transmitted through the mask 280 is irradiated onto the photosensitive film 280.

Figure 7B:
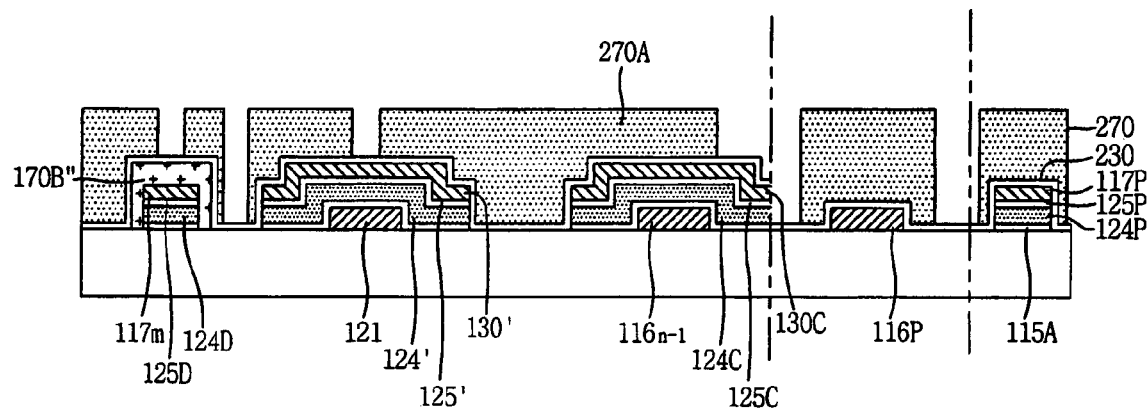

Subsequently, when the photosensitive film 270 which was exposed through the mask 280 is developed, as shown in FIG. 7b, photosensitive film patterns 270A remain with a certain thickness at regions where light was entirely blocked through the blocking region (III), and the photosensitive film at the transmission region (I) through which light was entirely transmitted was completely removed to expose the surface of the third conductive film 230. At this time, the photosensitive film at the region where the light entirely transmitted through the transmission region I was completely removed. This is because positive photoresist was used, but without being limited thereto, negative photoresist can be also used in the present invention.

Figure 7C:
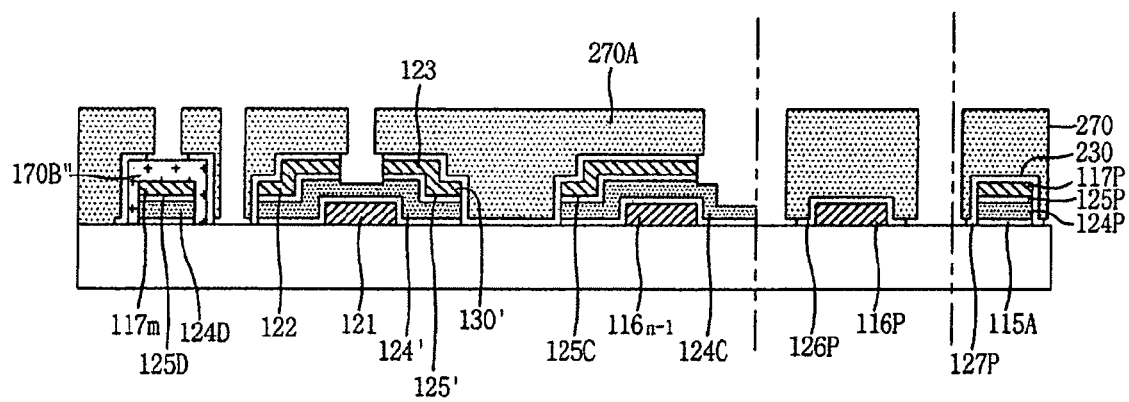

Thereafter, as shown in FIG. 7c, the second conductive film pattern 130' and the third conductive film 230 are selectively removed by using the photosensitive film patterns 270A as masks to form the source and drain electrodes 122 and 123, which are electrically connected with a certain region of the active pattern 124' (substantially, the source and drain regions formed at left and right side of the channel region of the active pattern 124') made of the amorphous silicon thin film through the ohmic contact layer 125' at the upper portion of the gate electrode 121 of the pixel part.

The third conductive film 230 from the upper portion of the drain electrode 123 to a certain region of the upper portion of the (n−1)th gate line 116n−1 is not removed by the photosensitive film pattern 270 and forms the pixel electrode.

Meanwhile, at a certain region of the upper portion of the (n−1)th gate line, the second conductive film pattern 130C and the third conductive film 230 are selectively removed by using the upper photosensitive film patterns 270A to form the storage capacity pattern 131 electrically connected with the pixel electrode 118 and also form the storage capacitor Cst together with the (n−1)th gate line 116n−1 with the first insulation film 115A interposed therebetween.

Herein, the third conductive film 230 is patterned through a wet etching and, in this case, the pattern is over-etched to form an undercut with a pattern smaller than the photosensitive film pattern 270A.

Thereafter, portions of the n+ amorphous silicon thin film pattern 125' and the active pattern 124' formed at certain regions of the upper portion of the gate electrode 121 of the pixel part are removed to pattern the n+ amorphous silicon thin film pattern 125' in the same shape as the source and drain electrodes 122 and 123. An ohmic-contact layer 125' formed of the n+ amorphous silicon thin film 125' is formed on the active pattern 124' and patterned in the same shape as the source and drain electrodes 122 and 123 to allow a certain region of the lower active pattern 124' and the source and drain regions 122 and 123 to be ohmic-contacted with each other.

In this case, a portion of the amorphous silicon thin film pattern 124C and the n+ amorphous silicon thin film pattern 125C on the (n−1)th gate line 116n−1 are also selectively removed.

The n+ amorphous silicon thin film pattern 125' and 125C, the active pattern and the n+ amorphous silicon thin film patterns 124' and 124C can be removed through wet-etching by using NH$_3$ plasma.

Meanwhile, the third conductive films 230 of the gate pad part and the data pad part of the substrate 110 are selectively removed through the etching to form the gate pad electrode 126P and the data pad electrode 127P respectively covering certain regions of the gate pad line 116P and the data pad line 117P so as to be electrically connected with the gate pad line 116P and the data pad line 117P.

Figure 7D:
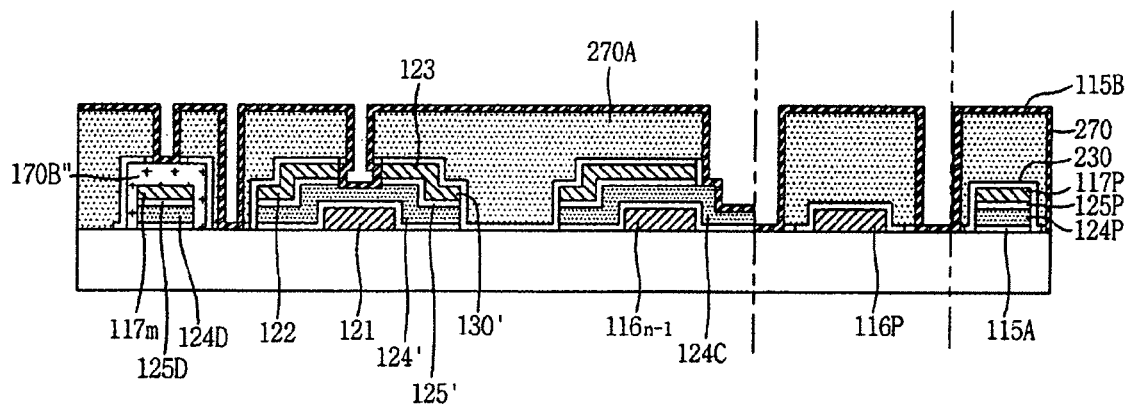

Next, as shown in FIG. 7d, the second insulation film is deposited with a certain thickness on the photosensitive film pattern 270A. In this case, the second insulation film is formed to protect the exposed channel area and can be formed of a silicon nitride oxide film (SiON), and preferably, has a thickness of 1000 Å or smaller.

Figure 7E:
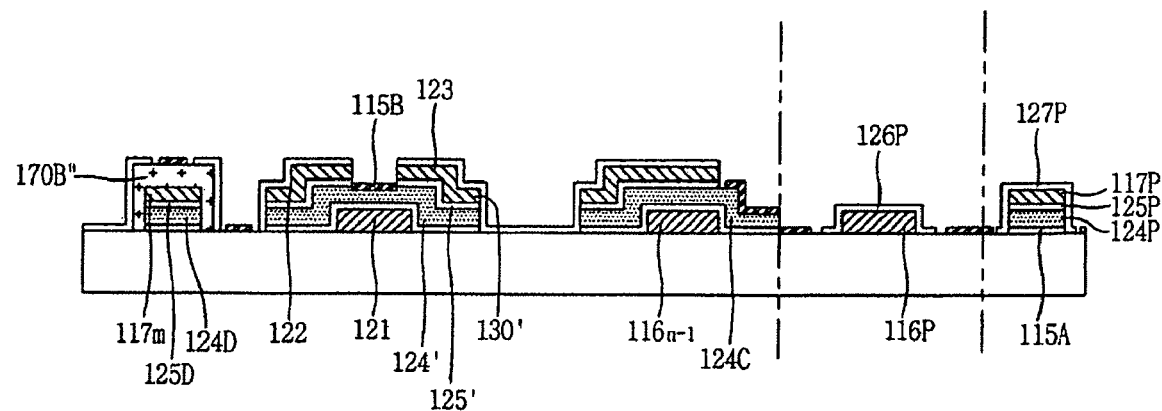

And then, as shown in FIG. 7e, the photosensitive film pattern 270A is lifted off to remove the second insulation film formed at an undesired portion together with photosensitive film pattern 270A.

In this case, as the photosensitive film pattern 270A formed at a certain region of the pixel part is lifted off, the pixel electrode 118 is exposed and electrically connected with a portion of the lower drain electrode 123. In this case, the drain electrode 123 is directly electrically connected with the upper pixel electrode 118 without a contact hole.

A portion of the corresponding pixel electrode 118 is electrically connected with the storage capacitor pattern 131 formed to overlap with the previous gate line 116n−1 at the upper portion of the previous gate line 116n−1. Thus, the storage capacitor pattern 131 electrically connected with the pixel electrode 118 forms the storage capacitor Cst together with the previous gate line 116n−1 with the lower first insulation film 115A interposed therebetween.

The thusly formed array substrate is attached with the color filter substrate (not shown) by a sealant formed at edges of an image display region in a facing manner. The color filter substrate includes black matrixes for preventing a light leakage to TFTs and gate lines and color filters for implementing red, green and blue.

The color filter substrate and the array substrate are attached through attachment keys formed either on the color filter substrate or on the array substrate.

In this manner, in the exemplary embodiment of the present invention, the array substrate can be fabricated through the total three times of masking processes, and in this case, the opaque data line light blocking pattern covering the upper and side portions of the data lines is formed as the photosensitive film pattern remaining at the upper portion of the data line is cured, so the black matrix is not formed at the upper portion of the data line. This will now be described.

Figure 8:
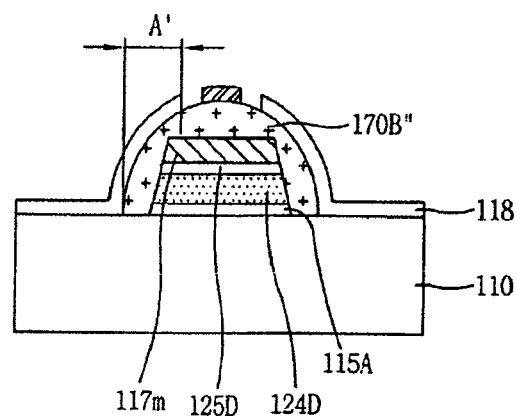
FIG. 8 is a sectional view taken along line VIII-VIII' of the data line according to the exemplary embodiment of the present invention.

FIG. 8 is a sectional view taken along line VIII-VIII' of the data line according to the exemplary embodiment of the present invention.

The upper and side portions of the mth data line 117m and the n+ amorphous silicon pattern 125D, the amorphous silicon pattern 124D and the first insulation film 115A formed at the lower portions of the data line 117m are covered by the data line light blocking pattern 170B".

The data line light blocking pattern 170B" are made of the opaque polyacryl and formed through curing to cover the data line 117m and the amorphous silicon layer 124D. Accordingly, it blocks light that may be generated at an upper portion of the data line 117m to thus prevent a wavy noise.

In addition, although portions of the pixel electrode 118 extend to both sides of the upper portion of the data line light blocking pattern 170B", the data line 117m and the pixel electrode 118 are insulated by the data line light blocking pattern 170B" , and the portions of the corresponding pixel electrode 118 extend to overlap with each other. Accordingly, there is little gap between the pixel electrode 118 and the data line 117m or the gap between the pixel electrode 118 and the data line 117m can be minimized, and light can be blocked by the data line light blocking pattern 170B" by a region (A') for preventing a light leakage at edges of the pixel electrode 118. Thus, the pixel region can be increased to increase an aperture ratio.

In the exemplary embodiment of the present invention, the amorphous silicon TFT using the amorphous silicon thin film is used as an example of the channel layer, but the present invention is not limited thereto and a polycrystalline silicon TFT using a polycrystalline silicon thin film can be also used as the channel layer.

As so far described, the LCD and its fabrication method according to the present invention have many advantages.

That is, for example, the wavy noise of the data lines can be prevented and the number of masks used for fabricating the TFTs can be reduced.

In addition, because the pixel electrodes can be formed on the data lines, a high aperture ratio can be obtained.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A method for fabricating an LCD comprising:
providing an array substrate and a color filter substrate facing the array substrate;
forming a gate electrode and a gate line formed of a first conductive film on the array substrate through a first masking process;
forming a second conductive film pattern at an upper portion of the gate electrode, a storage capacitor preliminary pattern at a partial upper region of the gate electrode and a data line substantially crossing the gate line to define a pixel region, the second conductive film pattern, the storage capacitor preliminary pattern and the data line being formed of a second conductive film through a second masking process;
forming an opaque insulation film surrounding the data line;
forming a transparent third conductive film on the entire surface of the array substrate with the opaque insulation film interposed therebetween;
patterning the second conductive film pattern, storage capacitor preliminary pattern, and a third conductive film through a third masking process to form a source electrode, a drain electrode separated from the source electrode, a pixel electrode contacting with the drain electrode, and a storage capacitor pattern contacting with a partial lower region of the pixel electrode; and
attaching the array substrate and the color filter substrate.

2. The method of claim 1, wherein in the first masking process, the first conductive film is deposited on the array substrate and patterned to form the gate electrode and the gate line.

3. The method of claim 1, wherein the second masking process comprises:
sequentially forming a first insulation film, an amorphous silicon thin film, an n+ amorphous silicon thin film and the second conductive film on the substrate with the gate electrode and the gate line formed thereon;
coating a first photosensitive film with opaque photoacryl on the substrate with the second conductive film formed thereon;
exposing light to the first photosensitive film through a mask having a transmission region that allows irradiated light to be entirely transmitted therethrough, a slit region that allows only some light to be transmitted therethrough and a blocking region that entirely blocks the light;
developing the first photosensitive film to which light was irradiated through the mask to form a first photosensitive film pattern and a second photosensitive film pattern thicker than the first photosensitive film pattern on the second conductive film; and removing the amorphous silicon thin film, the n+amorphous silicon thin film and the second conductive film by using the first and second photosensitive film patterns as masks to form the second conductive film pattern and the storage capacitor preliminary pattern at the lower portion of the first photosensitive film pattern and the data line substantially crossing the data line to define the pixel region at the lower portion of the second photosensitive film pattern.

4. The method of claim 3, wherein the process of forming the opaque insulation film surrounding the data line comprises:

ashing the first and second photosensitive film patterns to remove the first photosensitive film pattern; and forming the opaque insulation film by curing the second photosensitive film pattern such that it surrounds the data line.

5. The method of claim 4, wherein the curing process is performed at 100° C.~200° C.

6. The method of claim 1, wherein the third masking process comprises:

coating the second photosensitive film on the array substrate with the third conductive film formed thereon;

exposing light on the second photosensitive film through a mask having a transmission region that allows irradiated light to be transmitted therethrough and a blocking region that blocks the light; developing the second photosensitive film to which the light was irradiated through the mask, to form a third photosensitive film pattern; and removing portions of the third conductive film, the second conductive film pattern and the storage capacitor preliminary pattern, the n+ amorphous silicon layer and the amorphous silicon layer at the lower portion of the second conductive film pattern and the storage capacitor preliminary pattern by using the third photosensitive film pattern as a mask in order to form the source electrode, the drain electrode spaced apart from the source electrode, the pixel electrode contacting with the drain electrode, and a storage capacitor pattern contacting with a partial lower region of the pixel electrode.

7. The method of claim 6, wherein the process of removing the portions of the third conductive film, the second conductive film pattern and the n+ amorphous silicon layer and the amorphous silicon layer at the lower portion of the second conductive film pattern by using the third photosensitive film pattern as a mask comprises:

performing over-wet etching on portions of the transparent conductive film and the second conductive film pattern by using the third photosensitive film pattern as a mask; and dry-etching portions of the n+ amorphous silicon layer and the amorphous silicon layer by using the third photosensitive film pattern as a mask.

8. The method of claim 7, wherein in performing the dry-etching, $NH_3$ plasma is used.

9. The method of claim 6, wherein the third masking process comprises:

forming an insulation film on the entire surface of the substrate with the third photosensitive film pattern interposed therebetween after the step of forming the source and drain electrodes, the pixel electrode and the storage capacitor pattern; and lifting off the third photosensitive film pattern.

* * * * *